(12) United States Patent
Lee et al.

(10) Patent No.: US 9,196,575 B1
(45) Date of Patent: Nov. 24, 2015

(54) INTEGRATED CIRCUIT PACKAGE WITH CAVITY IN SUBSTRATE

(71) Applicant: Altera Corporation, San Jose, CA (US)

(72) Inventors: Myung June Lee, Cupertino, CA (US); Yuan Li, Sunnyvale, CA (US); Yuanlin Xie, Fremont, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 13/758,441

(22) Filed: Feb. 4, 2013

(51) Int. Cl.
| | | |
|---|---|---|
| H01L 23/04 | (2006.01) | |
| H01L 23/495 | (2006.01) | |
| H01L 23/498 | (2006.01) | |
| H01L 23/00 | (2006.01) | |
| H01L 25/065 | (2006.01) | |

(52) U.S. Cl.
CPC .... H01L 23/49568 (2013.01); H01L 23/49811 (2013.01); H01L 24/11 (2013.01); H01L 25/0657 (2013.01); *H01L 2224/48091* (2013.01); *H01L 2924/01079* (2013.01)

(58) Field of Classification Search
CPC ............... H01L 25/0657; H01L 2924/01079; H01L 2224/48091
USPC .......... 257/E23.174, 685, 686, 706, 707, 712, 257/713, 723, 728, 738, 777
IPC .................................................. H01L 25/0657
See application file for complete search history.

(56) References Cited

U.S. PATENT DOCUMENTS

| | | | |
|---|---|---|---|
| 5,646,828 A * | 7/1997 | Degani et al. ............. | 361/715 |
| 5,726,079 A | 3/1998 | Johnson | |
| 5,869,894 A * | 2/1999 | Degani et al. ............. | 257/723 |
| 5,883,430 A | 3/1999 | Johnson | |
| 6,150,724 A * | 11/2000 | Wenzel et al. ............. | 257/777 |
| 6,265,771 B1 * | 7/2001 | Ference et al. ............ | 257/706 |
| 6,507,115 B1 * | 1/2003 | Hofstee et al. ............ | 257/777 |
| 6,632,704 B2 | 10/2003 | Kumamoto et al. | |
| 6,768,190 B2 | 7/2004 | Yang et al. | |
| 6,815,829 B2 * | 11/2004 | Shibata .................... | 257/777 |
| 6,825,567 B1 * | 11/2004 | Wang et al. .............. | 257/777 |
| 6,847,105 B2 * | 1/2005 | Koopmans ................ | 257/686 |
| 6,861,761 B2 | 3/2005 | Yang et al. | |
| 6,963,130 B1 * | 11/2005 | Djekic ..................... | 257/706 |
| 6,995,463 B1 * | 2/2006 | Sutardja .................. | 257/686 |
| 6,998,292 B2 * | 2/2006 | McDonough et al. ...... | 438/107 |
| 7,098,542 B1 * | 8/2006 | Hoang et al. ............. | 257/778 |
| 7,176,579 B2 * | 2/2007 | Konishi et al. ........... | 257/777 |
| 7,198,980 B2 * | 4/2007 | Jiang et al. ............... | 438/107 |
| 7,268,426 B2 * | 9/2007 | Warner et al. ............ | 257/707 |
| 7,646,093 B2 * | 1/2010 | Braunisch et al. ........ | 257/718 |
| 7,649,249 B2 * | 1/2010 | Noguchi .................. | 257/686 |
| 7,656,030 B2 * | 2/2010 | Osone et al. ............. | 257/728 |
| 8,110,915 B2 * | 2/2012 | Fowlkes et al. .......... | 257/692 |
| 8,183,089 B2 * | 5/2012 | Choi et al. ............... | 438/108 |
| 8,247,900 B2 | 8/2012 | Yuan | |
| 8,472,190 B2 * | 6/2013 | Refai-Ahmed et al. ... | 361/704 |
| 8,519,537 B2 * | 8/2013 | Jeng et al. ............... | 257/738 |
| 2004/0217485 A1 * | 11/2004 | Chung ..................... | 257/778 |
| 2006/0145328 A1 * | 7/2006 | Hsu ......................... | 257/690 |
| 2008/0099891 A1 * | 5/2008 | Kato et al. ............... | 257/666 |
| 2009/0236706 A1 * | 9/2009 | Chen ....................... | 257/675 |

* cited by examiner

*Primary Examiner* — Eugene Lee (57) ABSTRACT

Integrated circuit packages with heat dissipation function are disclosed. A disclosed integrated circuit package includes a first die attached on a top surface of a second die. The second die may be coupled to a thermally conductive block. The thermally conductive block may be embedded in a cavity formed in a package substrate. A heat spreading lid may be disposed over the package substrate. The integrated circuit package may be disposed on a printed circuit substrate via solder bumps or balls. The printed circuit substrate may have heat dissipation paths to dissipate heat from the integrated circuit package.

17 Claims, 9 Drawing Sheets

INTEGRATED CIRCUIT PACKAGE WITH CAVITY IN SUBSTRATE

BACKGROUND

With an increasing demand for higher performance and density, integrated circuit devices may continuously need to include more components and dies to meet the requirements of different applications. As such, components may be stacked on top of each other or placed closer on printed circuit boards to reduce device dimension and cost. For example, in a multi-die integrated circuit package, multiple dies may be stacked on top of each other.

However, the utilization of higher performing and higher powered integrated circuit devices may lead to heat dissipation problem. Excessive heat generated by the numerous dies in a multi-die integrated circuit package may cause components within the package to malfunction.

SUMMARY

In accordance with the present invention, apparatuses and methods are provided for creating an integrated circuit package with improved heat dissipation.

It is appreciated that the present invention can be implemented in numerous ways, such as a process, an apparatus, a system, or a device. Several inventive embodiments of the present invention are described below.

A method of packaging integrated circuits is disclosed. The method includes attaching a first integrated circuit die to a top surface of a second integrated circuit die. A thermally conductive block is formed on a package substrate and a bottom surface of the second integrated circuit die is attached to the thermally conductive block. The method further includes attaching a heat spreader structure to a top surface of the first integrated circuit die and disposing a heat spreading lid over the package substrate.

A provided integrated circuit package may include a first die, a second die with opposing top and bottom surfaces and a package substrate with a plurality of thermally conductive vias. The first die is attached to the top surface of the second die. The integrated circuit package also includes a thermally conductive block on the package substrate over the thermally conductive vias. The thermally conductive block may be coupled to the bottom surface of the second die.

Another integrated circuit package may include a first die attached to a top surface of a second die and a substrate with a cavity. The cavity may contain a thermally conductive block. The thermally conductive block is attached to the bottom surface of the second die.

Further features of the invention, its nature and various advantages, will be more apparent from the accompanying drawings and the following detailed description of the preferred embodiments.

DETAILED DESCRIPTION

The embodiments provided herein include integrated circuit structures and packaging techniques for improved heat dissipation.

It will be obvious, however, to one skilled in the art, that the present exemplary embodiments may be practiced without some or all of these specific details. In other instances, well-known operations have not been described in detail in order not to obscure unnecessarily the present embodiments.

Figure 1:
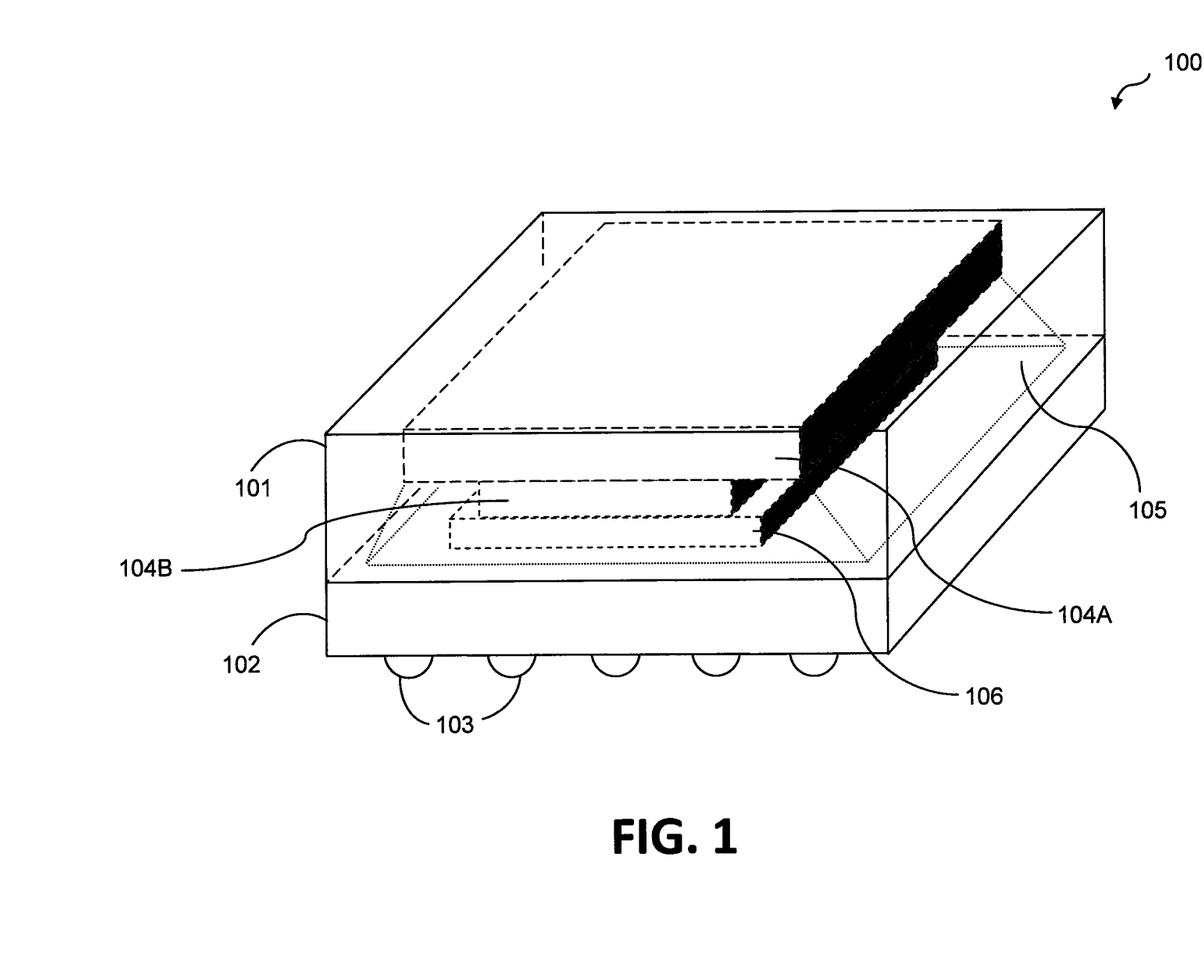
FIG. 1 is an isometric view of an illustrative integrated circuit package with two dies and a thermally conductive block placed in between the two dies and a package substrate in accordance with an embodiment of the present invention.

FIG. 1 is an isometric view of an illustrative integrated circuit package 100 with two dies 104A-104B and a thermally conductive block 106 placed in between dies 104A-104B and package substrate 102 in accordance with an embodiment of the present invention. In the embodiment of FIG. 1, die 104A may be disposed on the top surface of die 104B to form a die stack. Thermally conductive block 106 may be formed on package substrate 102. In one embodiment, thermally conductive block 106 may be made of silicon or any other materials with high thermal conductivity.

Die 104B may be disposed over thermally conductive block 106 to further dissipate heat from integrated circuit package 100. Underfill material 105 such as epoxy may be deposited on package substrate 100 to fill the gap under dies 104A-104B. Heat spreading lid 101 may be disposed over package substrate 102 and dies 104A-104B to allow heat to escape from integrated circuit package 100. Heat spreading lid 101 may substantially cover dies 104A-104B and a top surface of package substrate 102 to protect dies 104A-104B from external contaminants. Solder bumps or balls 103, disposed on the bottom surface of package substrate 102, may be used to connect integrated circuit package 100 to external circuitry.

Figure 2A:
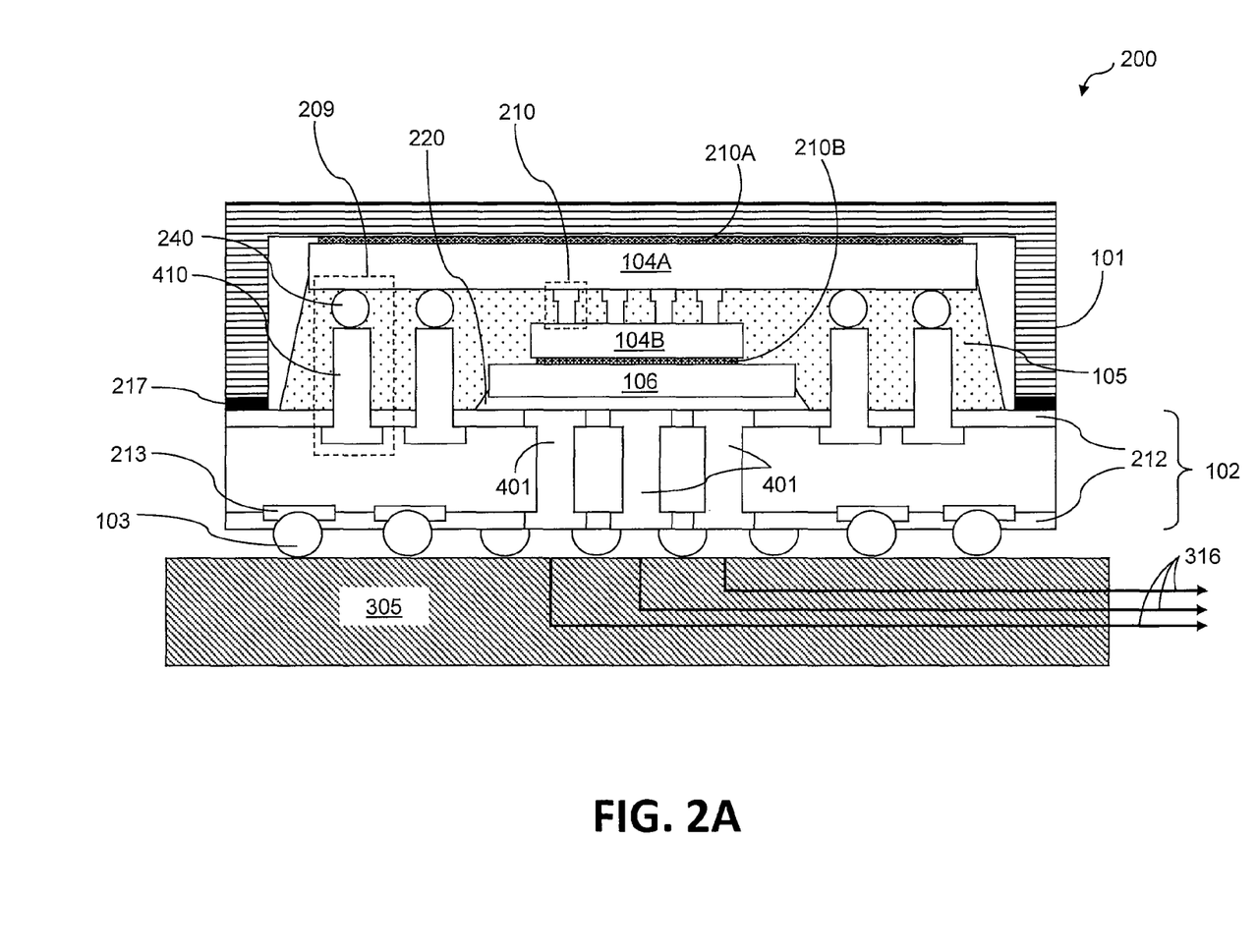
FIG. 2A is a side view of an illustrative integrated circuit package in accordance with an embodiment of the present invention.

FIG. 2A is a side view of an illustrative integrated circuit package 200 in accordance with an embodiment of the present invention. It should be appreciated that integrated circuit package 200 may share similarities with integrated circuit package 100 of FIG. 1. As such, for the sake of brevity, elements that have been described above, such as underfill 105, heat spreading lid 101, thermally conductive block 106 and solder bumps or balls 103, will not be described in detail.

In one embodiment, thermally conductive material may be placed on heat-generating integrated circuit components such as dies 104A and 104B to facilitate heat transfer. As an example, thermally conductive material 210A may be placed on the top surface of die 104A. Thermally conductive material 210A may also be used to fill the gap between die 104A and heat spreading lid 101 to increase thermal transfer efficiency. As an example, thermally conductive material 210A may be a thermal interface material (TIM). In another example, thermally conductive material 210B may be placed between die 104B and thermally conductive block 106. In one embodiment, thermally conductive material 210B may facilitate heat transfer, therefore allowing for better heat dissipation from die 104B.

Die 104A may be coupled to package substrate 102 through support members 209. In one embodiment, support members 209 may provide joint support between die 104A and package substrate 102. Signals from die 104A may travel to die 104B and package substrate 102 through support members 209 and solder bumps 240 (e.g., copper bumps). As an example, support pillars 410 may be copper posts.

Another support member (e.g., support member 210) may act as a communication pathway between die 104A and die 104B. Support members 210 may be copper pillars. For example, signals from die 104A may travel to die 104B via support members 210. It should be appreciated that support members 210 may be of different heights and diameters. It should also be appreciated that a variety of support members 209 and 210 having different configurations may be employed in this context. As an example, support members 209 and 210 may be microbumps.

In the embodiment of FIG. 2A, package substrate 102 may include a plurality of thermally conductive vias 401. Thermally conductive vias 401 provide thermal pathways to transfer heat out of integrated circuit package 200. For example, heat from thermally conductive block 106 may travel through the plurality of thermal vias 401.

Package substrate 102 may further include one or more layers of build-up film 212 that may cover the top and/or the bottom surface of package substrate 102. In one embodiment, build-up film 212 may include solder-resist ink. A more detailed description of the structure of package substrate 102 will be described later with reference to package substrate 300 of FIGS. 3A-3C.

Heat spreading lid 101 may be attached to package substrate 102 through adhesive 217. Adhesive 217 may be an epoxy in the form of paste or glue.

In the embodiment of FIG. 2A, integrated circuit package 200 may be disposed on printed circuit substrate 305. In one embodiment, printed circuit substrate 305 may include multiple heat dissipation paths 316. Heat dissipation paths 316 may dissipate heat out of integrated circuit package 200. For example, heat dissipation paths 316 may dissipate heat received from thermally conductive vias 401. Contact pads 213 may be coupled to solder bumps or balls 103 to transmit signals out of integrated circuit package 200. As an example, contact pads 213 may be formed by depositing copper or other conductive materials to form contacts on the bottom surface of package substrate 102.

Figure 2B:
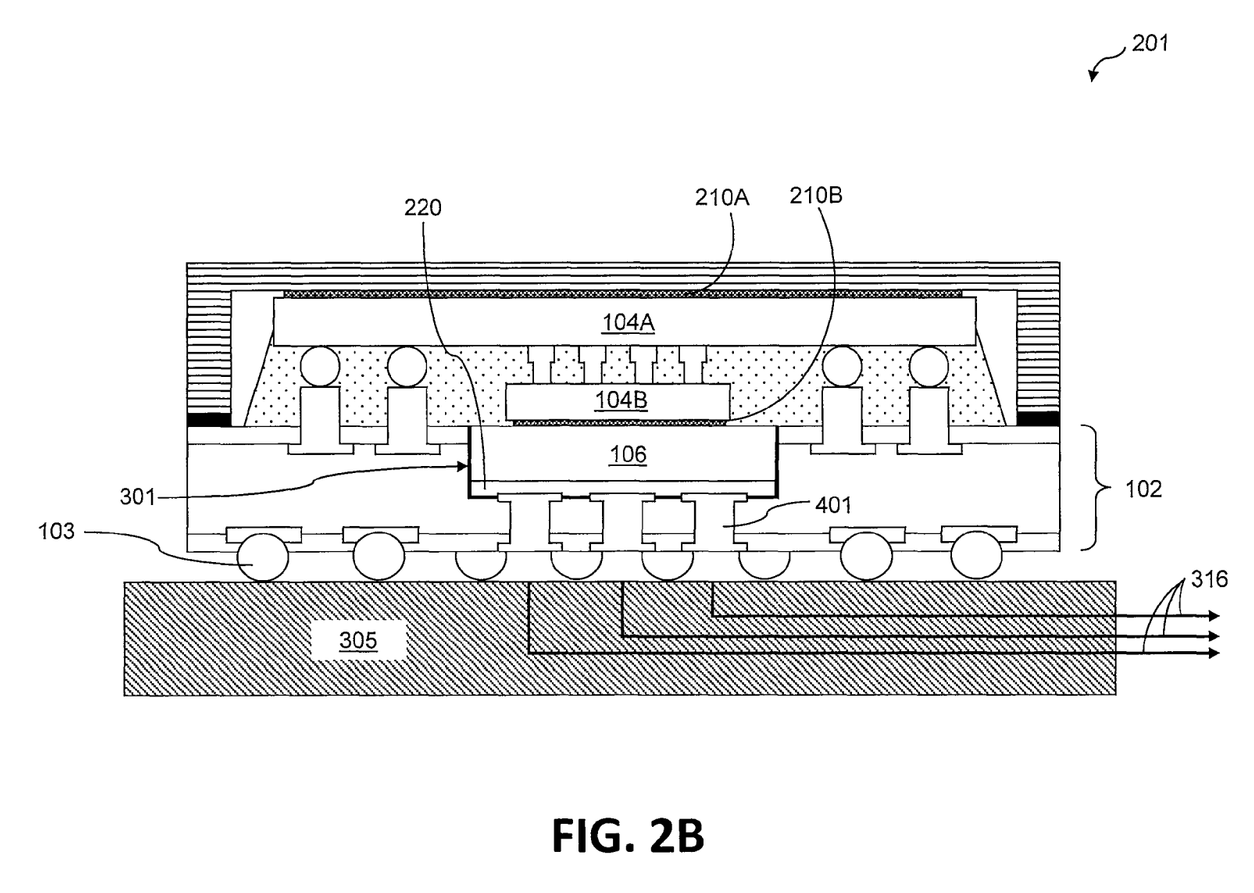
FIG. 2B is a side view of an illustrative integrated circuit package with a thermally conductive block and thermal vias embedded in a package substrate in accordance with an embodiment of the present invention.

FIG. 2B is a side view of an illustrative integrated circuit package 201 with thermally conductive block 106 and thermal vias 401 embedded in package substrate 102 in accordance with an embodiment of the present invention. It should be appreciated that integrated circuit package 201 may share similarities with integrated circuit package 100 of FIG. 1. As such, for the sake of brevity, elements that have been described above (e.g., dies 104A-104B, thermally conductive block 106, thermally conductive materials 210A-210B and thermally conductive vias 401) will not be described in detail.

Adhesive 220 may be used to attach thermally conductive block 106 that may form in package substrate 102. Thermally conductive block 106 may act as a heat transfer element for die 104B. When thermally conductive block 106 is embedded in package substrate 102, thermally conductive vias 401 may be coupled to thermally conductive block 106. Thermally conductive vias 401 may directly transfer heat from thermally conductive block 106 out of integrated circuit package 201.

In the embodiment of FIG. 2B, thermally conductive vias 401 may be coupled to printed circuit substrate 305 through solder bumps or balls 103. Heat transmitted from thermally conductive vias 401 may be dispersed via printed circuit substrate 305. In one embodiment, heat dissipation paths 316 on printed circuit substrate 305 may dissipate heat from thermally conductive vias 401.

Figure 2C:
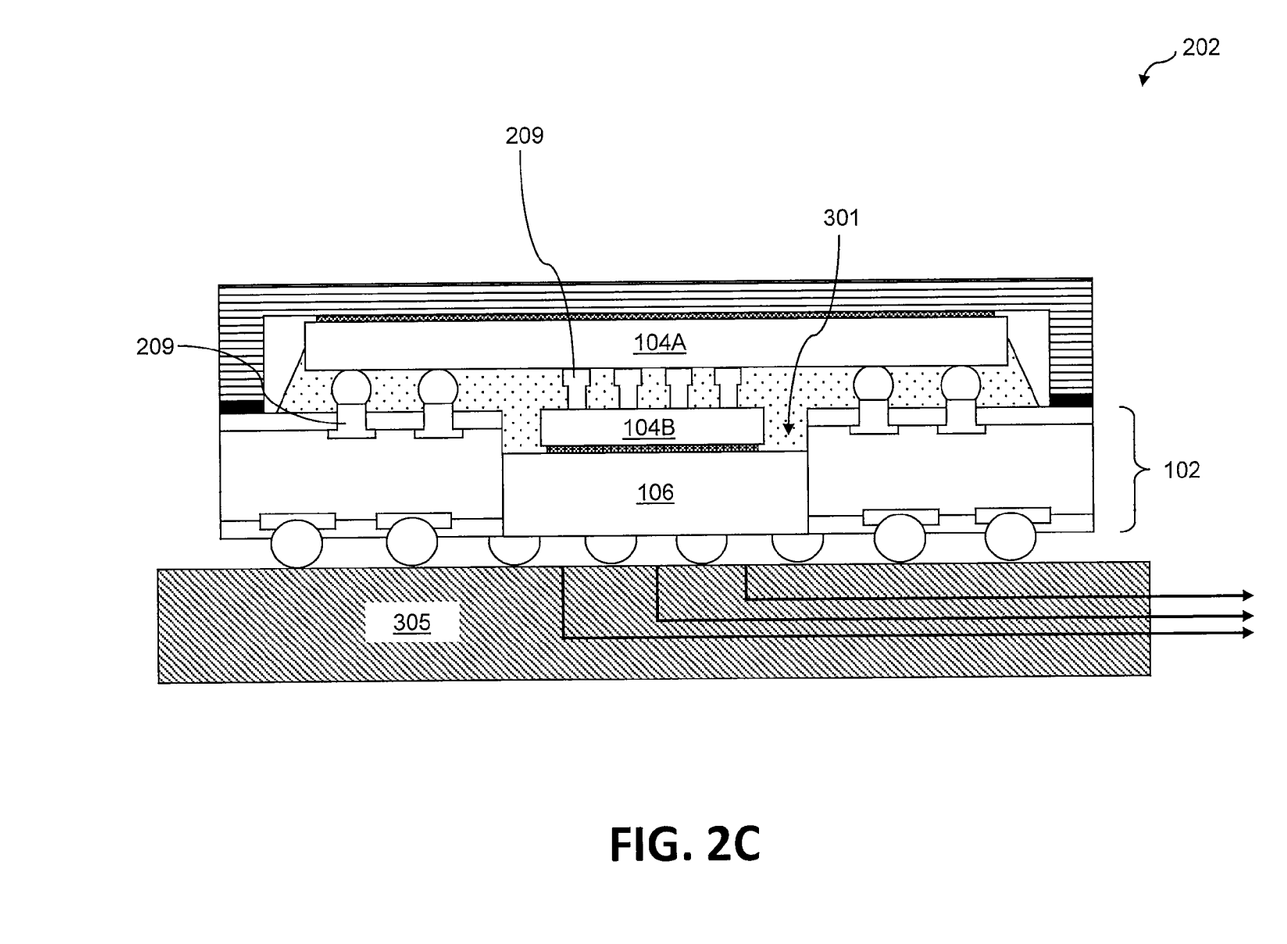
FIG. 2C is a side view of an illustrative integrated circuit package with a cavity formed in a package substrate in accordance with an embodiment of the present invention.

In some scenarios, lower profile integrated circuit packages may be provided. FIG. 2C is a side view of an illustrative integrated circuit package 202 with a cavity formed in package substrate 102 in accordance with an embodiment of the present invention.

It should be appreciated that for the sake of brevity, components already shown in integrated circuit package 100 of FIG. 1, integrated circuit package 200 of FIG. 2A and integrated circuit package 201 of FIG. 2B (e.g., dies 104A-104B, thermal conductive block 106, thermally conductive materials 210A-210B, underfill material 105, thermal spreading lid 101 and solder bumps or balls 103) and described above will not be repeated.

When a cavity (e.g., cavity 301) is formed in package substrate 102, thermally conductive block 106 may be placed in the cavity. In one embodiment, thermally conductive block 106 may conduct heat from passive components that are embedded in or placed under die 104A to improve heat dissipation. The structure of cavity 301 of package substrate 102 will be described in detailed with reference to package substrate 300 of FIGS. 3A-3C. In one embodiment, thermally conductive block 106 may act as interconnect between die 104B and printed circuit package 305.

Figure 3A:
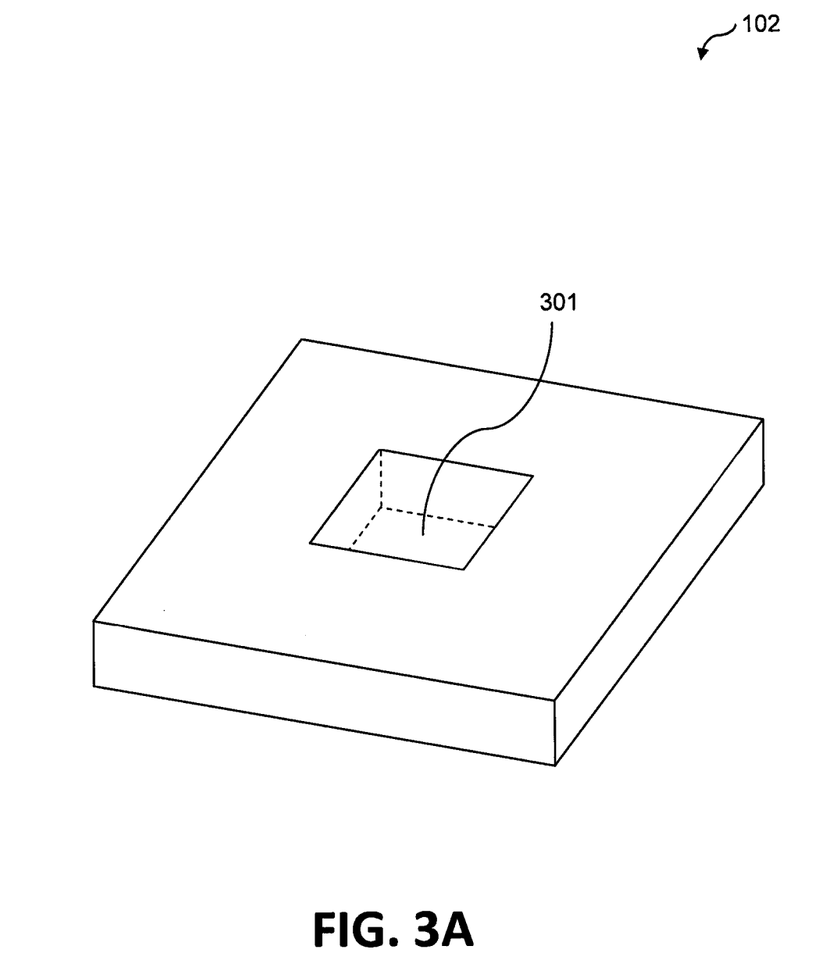
FIG. 3A is an isometric view of an illustrative package substrate in accordance with an embodiment of the present invention.

FIG. 3A is an isometric view of an illustrative package substrate 102 shown in FIGS. 1, 2A, 2B and 2C in accordance with an embodiment of the present invention. In one embodiment, cavity 301 may be formed in package substrate 102. As an example, cavity 301 may be an open-structured cavity. The open-structured cavity may allow faster heat dissipation without going through package substrate 102. A thermally conductive block may be formed within cavity 301. In the embodiment of FIG. 2C, thermally conductive block 106 is formed within cavity 301 to facilitate heat transfer from die 104B out of integrated circuit package 202. Examples of the different configurations of package substrate 102 will be described later with reference to FIGS. 3B and 3C.

Figure 3B:
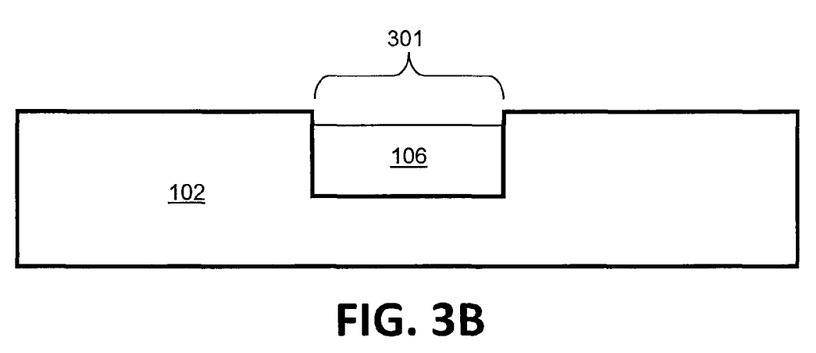
FIG. 3B is a side view of a package substrate in accordance with one embodiment of the present invention.

FIG. 3B is a side view of package substrate 102 in accordance with one embodiment of the present invention. Thermally conductive block 106 may be embedded in package substrate 102. As shown in FIG. 2B, multiple thermally conductive vias (e.g., thermally conductive vias 401) may be disposed under thermally conductive block 106 in package substrate 102. Thermally conductive vias 401 may be attached to thermally conductive block 106 via adhesive layer 230.

Figure 3C:
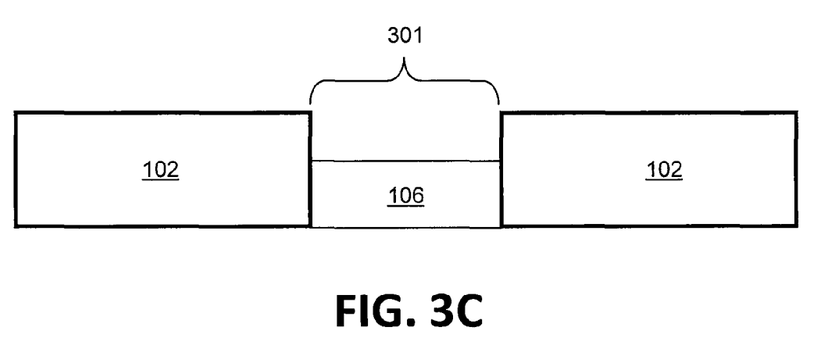
FIG. 3C is a side view of a thermally conductive block inside a cavity of a package substrate in accordance with one embodiment of the present invention.

FIG. 3C is a side view of thermally conductive block 106 in cavity 301 of package substrate 102 in accordance with one embodiment of the present invention. Thermally conductive block 106 may be inserted in cavity 301 of FIG. 3A. In one embodiment, thermally conductive block 106 may act as interconnect between components (such as dies) that are placed on top of thermally conductive block 106 and external circuitry. As such, thermally conductive block 106 may dissipate heat and transmit signals from components within an integrated circuit package (e.g., die 104B of FIG. 2C, disposed on thermally conductive block 106).

Figure 4:
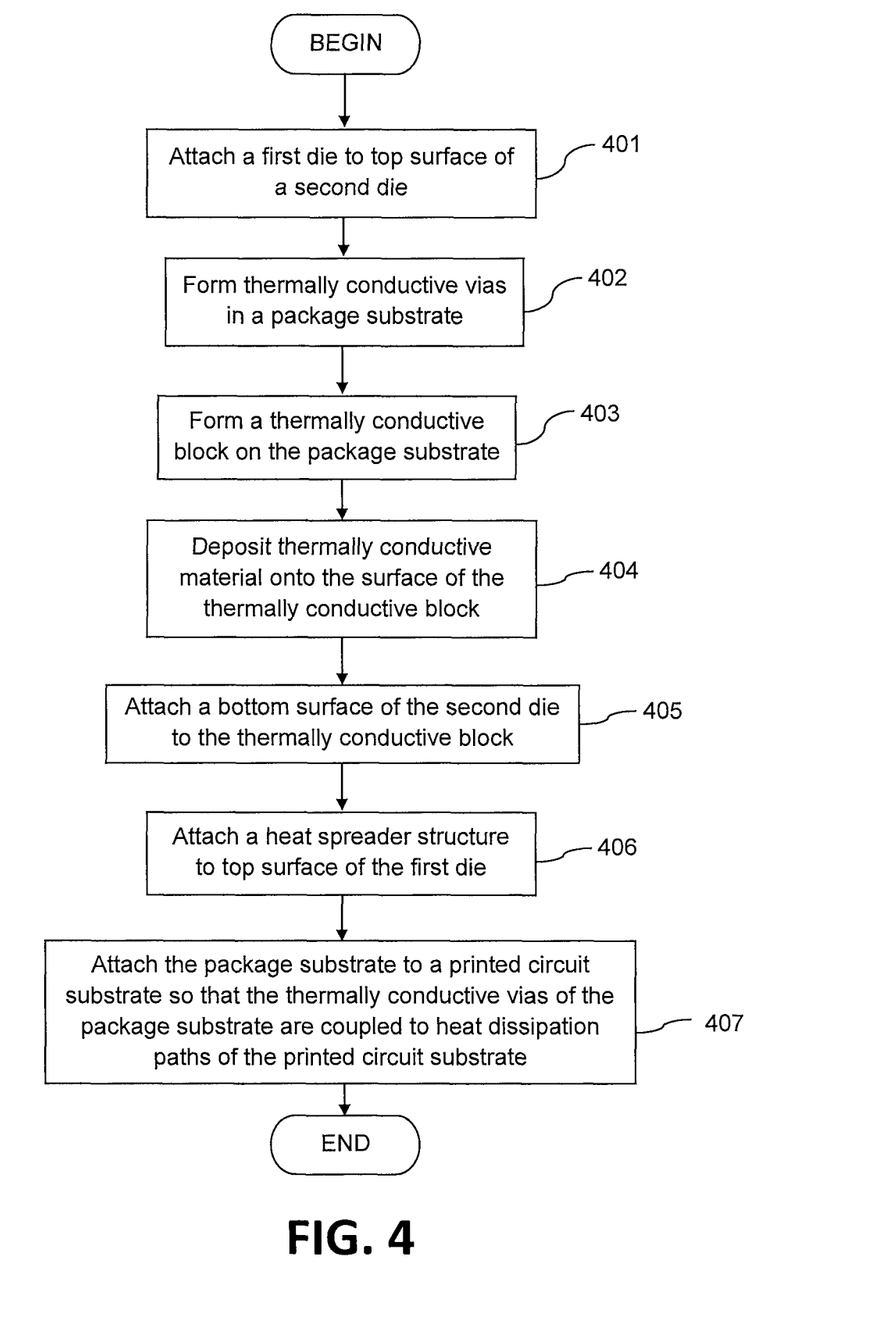
FIG. 4 is an illustrative flowchart for packaging an integrated circuit in accordance with an embodiment of the present invention.

An illustrative flowchart for packaging an integrated circuit in accordance with an embodiment of the present invention is shown in FIG. 4. At step 401, a first die is attached to a top surface of a second die. In an exemplary embodiment, a plurality of pillars (e.g., support members 210 of FIGS. 2A-2C) on the second die may electrically couple the second die to the first die. In the embodiment of FIG. 2A, die 104A may be electronically coupled to die 104B through support members 210.

At step 402, thermally conductive vias are formed in a package substrate. In the embodiment shown of FIG. 2B, the thermally conductive vias (e.g., thermally conductive vias 401) may provide thermal pathways to transfer heat from an integrated circuit package (e.g., integrated circuit package 201 of FIG. 2A). In the embodiment of FIG. 2A, heats from dies 104A-104B may be transmitted out of integrated circuit package 201 via thermally conductive vias 401.

In another embodiment, parallel manufacturing processes may be adopted in integrated circuit packaging. For example, different packaging or manufacturing processes such as multi-die packaging process (e.g., step 401) and the manufacturing process of a package substrate (e.g., steps 401 and 402) may be performed in parallel to save time and cost.

At step 403, a thermally conductive block is formed on the package substrate. In the embodiment of FIG. 2A, thermally conductive block 106 may be formed on package substrate 102 and adhesive 220 may be used to attach thermally conductive material 106 to package substrate 102. In another embodiment, the thermally conductive block may be embedded in the package substrate. As an example, the package substrate may provide an embedding space (e.g., cavity 301 of FIGS. 3A-3C) for thermally conductive block 106 of FIG. 2A.

At step 404, in the embodiment of FIG. 2A, thermally conductive material 210B may be deposited onto the surface of the thermally conductive block as adhesive to attach die 104B onto thermally conductive block 106.

At step 405, a bottom surface of the second die is attached to the thermally conductive block. An adhesive such as thermally conductive material 210B of FIG. 2A may be used to attach die 104B to thermally conductive block 106.

At step 406, a heat spreader structure is attached to a top surface of the first die. The heat spreader structure may dissipate heat from the first die. As shown in FIG. 2A, heat spreader structure such as thermally conductive material 210A may dissipate heat generated by die 104A. Heat spreading lid 101 may be placed on top of thermally conductive material 210A to dissipate excess heat from integrated circuit package 200. It should be appreciated that heat spreading lid 101 may be made of highly conductive material in order to effectively transfer heat generated by integrated circuit components (e.g., die 104A, die 104B, etc.) out of integrated circuit package 200.

At step 407, the package substrate is attached to a printed circuit substrate so that the thermally conductive vias of the package substrate are coupled to the heat dissipation paths of the printed circuit substrate. For example, in the embodiments of FIG. 2A, thermally conductive vias 401 are coupled to heat dissipation paths 316 of printed circuit substrate 305 through solder bumps or balls 103. Thermally conductive vias 401 may facilitate heat transfer to heat dissipation paths 316 and thereby enhance thermal performance in integrated circuit package 200.

Figure 5:
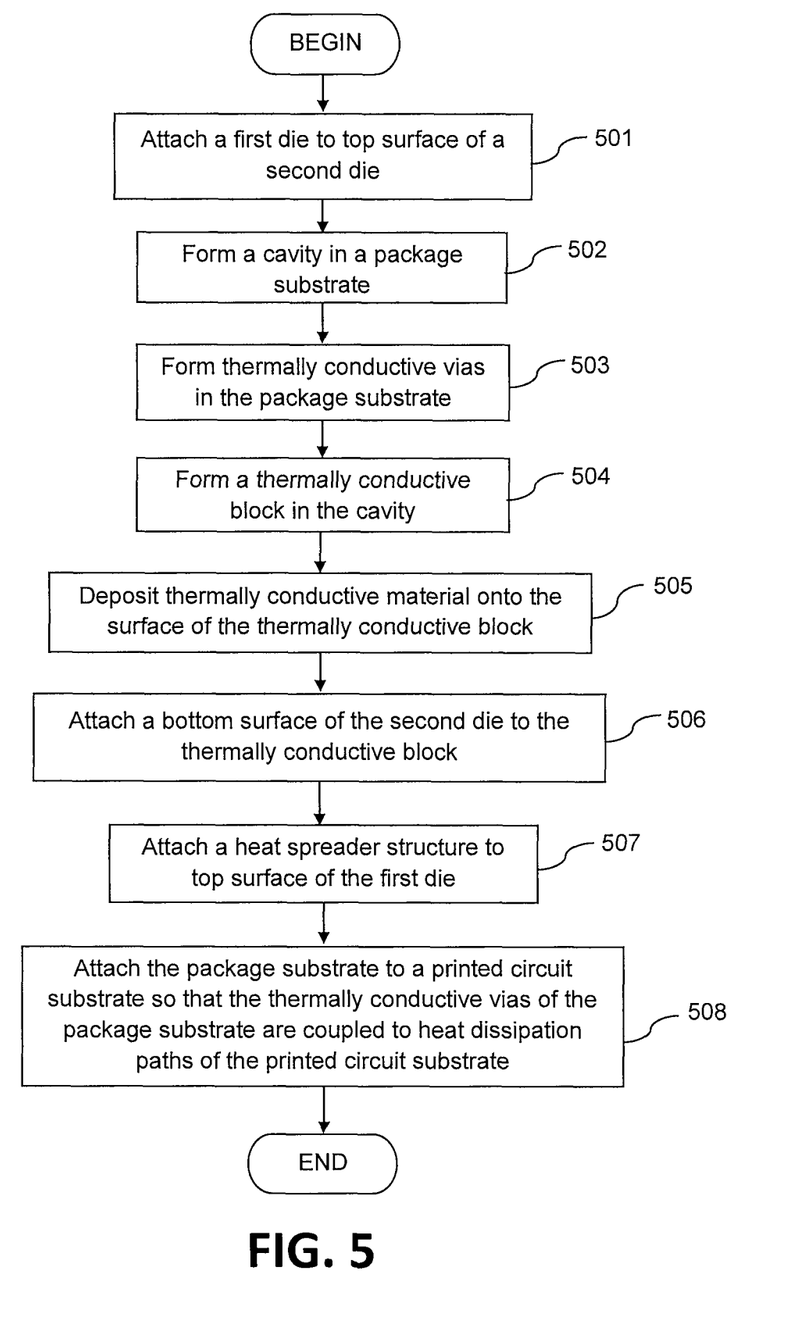
FIG. 5 is another illustrative flowchart for packaging an integrated circuit in accordance with an embodiment of the present invention.

An illustrative flowchart for packaging an integrated circuit in accordance with an embodiment of the present invention is shown in FIG. 5. At step 501, a first die is attached to a top surface of a second die. As shown in FIG. 2B, die 104A may be attached to the top surface of die 104B via support members 210. Support members 210 may include support pillars such as copper posts. In another embodiment, support members 210 may include microbumps.

At step 502, a cavity is formed in a package substrate. As shown in FIG. 3A, cavity 301 may be formed in package substrate 102 of FIGS. 2B and 2C. As illustrated in FIGS. 3B and 3C, cavity 301 may have a shape and dimensions. Depending on the dimensions of the cavity, thermally conductive vias may be formed in the package substrate at step 503. As an example, thermally conductive vias (e.g., thermally conductive vias 401 of FIG. 2B) may be formed in the space below cavity 301 of FIG. 3B of package substrate 102.

A thermally conductive block may also be formed in the cavity at step 504. In one embodiment, a thermally conductive material may be disposed within cavity 301 of FIG. 3A to form a block, such as thermally conductive block 106 of FIG. 2B. Disposed between thermally conductive block 106 and thermally conductive vias 401 may be an adhesive layer (e.g., adhesive layer 220 of FIG. 2B) that attaches thermally conductive block 106 to thermally conductive vias 401.

In practice, one or more steps involving the same integrated components may be combined with other steps, performed in any suitable order, performed in parallel (e.g., simultaneously or substantially simultaneously), or removed. For example, steps 502-504 involve a package substrate and these steps may be combined and performed in parallel with step 501.

At step 505, thermally conductive material is deposited onto the surface of the thermally conductive block. At step 506, the bottom surface of the second die is attached to the thermally conductive block. As shown in the embodiment of FIG. 2A, thermally conductive material 210B may attach die 104B to thermally conductive block 106. In one embodiment, thermally conductive material 210B may be a heat cure adhesive.

At step 507, a heat spreader structure is attached to a top surface of the first die. In the embodiment of FIG. 2A, the heat spreader structure may include thermally conductive material 210A. Thermally conductive material 210A may be configured to have a uniform thickness to facilitate heat transfer from die 104A. A heat spreading lid such as heat spreading lid 101 may be placed on top of thermally conductive material 210A over a package substrate such as package substrate 102. Adhesive 217 of FIG. 2A may be used to connect heat spreading lid 101 to package substrate 102.

At step 508, the package substrate is attached to a printed circuit substrate so that the thermally conductive vias of the package substrate are coupled to the heat dissipation paths of the printed circuit substrate. In the embodiment of FIG. 2B, package substrate 102 may be attached to printed circuit substrate 305. The thermally conductive vias 401 embedded in package substrate 102 may be coupled to printed circuit substrate 305 via solder bumps or balls 103. In one embodiment, printed circuit substrate 305 may be an interposer substrate.

Figure 6:
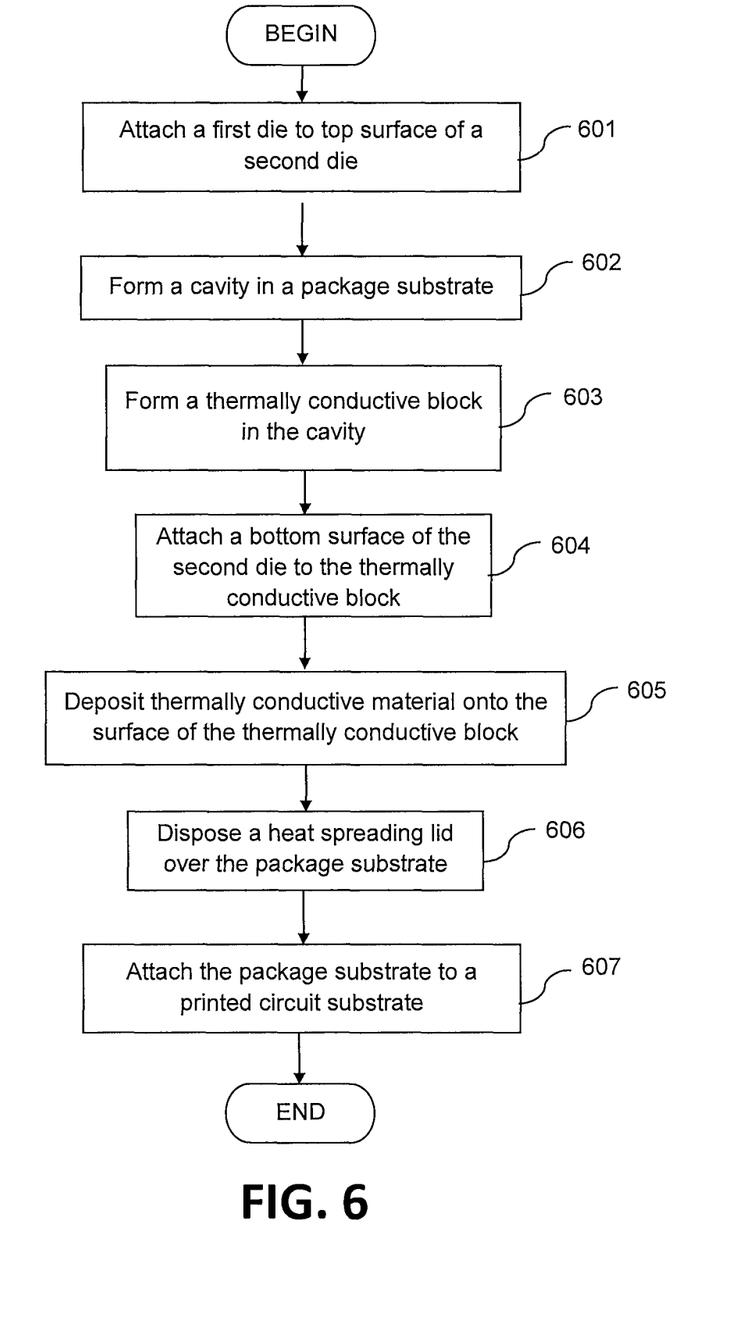
FIG. 6 is an illustrative flowchart for packaging an integrated circuit with a cavity formed in a package substrate in accordance with an embodiment of the present invention.

An illustrative flowchart for packaging an integrated circuit with a cavity formed in a package substrate in accordance with an embodiment of the present invention is shown in FIG. 6.

At step 601, a first die is attached to a top surface of a second die. Multiple support members may be placed between the first die and the second die to act as signal pathways and provide mechanical support. As shown in FIG.

2C, support members 209 may form signal pathways for signal transmission between die 104A and die 104B. For example, support members 209, such as copper pillars, may electrically couple die 104A and die 104B.

At step 602, a cavity is formed in a package substrate. As shown in FIG. 3A, cavity 301 may be formed in package substrate 102 and a thermally conductive block (e.g., thermally conductive block 106 of FIG. 2C) may be formed in cavity 301 at step 603. In one embodiment, one or more steps can be performed in any suitable order to save time and cost. For example, step 601 can be performed in parallel with steps 602 and 603.

At step 604, a thermally conductive material may be deposited onto the surface of thermally conductive block 106. Thermally conductive material 210B may provide uniform heat dissipation for the second die (e.g., die 104B of FIGS. 2A-2C). The bottom surface of the second die is attached to the thermally conductive block at step 605. In the example of FIG. 2A, heat generated by die 104B may be dissipated through thermally conductive block 106.

At step 606, a heat spreading lid is attached to the top surface of the first die. In the embodiment of FIG. 2A, heat spreading lid 101 may be disposed over die 104A. The thermally conductive material 210A may be configured to have a uniform thickness to facilitate heat transfer from die 104A.

At step 607, the package substrate is attached to a printed circuit substrate. In one embodiment, the printed circuit substrate may be thermally conductive. In the embodiment of FIG. 2C, heat from integrated circuit package 202 may be dissipated through printed circuit substrate 305.

The method and apparatus described herein may be incorporated into any suitable circuit. For example, the method and apparatus may be incorporated into numerous types of devices such as microprocessors or other integrated circuits. Exemplary integrated circuits include programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), just to name a few.

The programmable logic device described herein may be part of a data processing system that includes one or more of the following components; a processor; memory; I/O circuitry; and peripheral devices. The data processing system can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by the assignee.

Although the method operations were described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention.

What is claimed is:

1. An integrated circuit package comprising:
   a package substrate having a topmost surface and a cavity formed in the topmost surface, wherein the package substrate further includes a plurality of thermally conductive vias;
   a first die;
   a second die, wherein the second die includes opposing top and bottom surfaces, wherein the first die is attached to the top surface of the second die, and wherein the second die is formed above the topmost surface of the package substrate; and
   a thermally conductive block in the cavity over the thermally conductive vias, wherein the thermally conductive block is coupled to the bottom surface of the second die.

2. The integrated circuit package defined in claim 1, wherein the first die comprises opposing top and bottom surfaces, wherein the top surface of the second die is attached to the bottom surface of the first die, the integrated circuit package further comprising:
   a thermally conductive material disposed onto the top surface of the first die; and
   a heat spreading lid that covers the thermally conductive material.

3. The integrated circuit package defined in claim 1 further comprising:
   a plurality of support members that electrically couple the first die to the second die.

4. The integrated circuit package defined in claim 3 wherein the plurality of support members comprises of copper pillars.

5. The integrated circuit package defined in claim 1 wherein an underfill material is deposited on the package substrate under the first and second dies.

6. The integrated circuit package defined in claim 1 wherein the package substrate is disposed on a printed circuit substrate through a plurality of connections, wherein each connection of the plurality of connections is selected from the group consisting of microbumps and solder balls.

7. The integrated circuit package defined in claim 4 wherein the package substrate is thermally conductive.

8. An integrated circuit package comprising:
   a first die attached to a top surface of a second die;
   a substrate having a cavity, wherein the substrate has an upper surface portion and a lower surface portion at the bottom of the cavity;
   a thermally conductive block formed on the lower surface portion of the substrate within the cavity, wherein the thermally conductive block is attached to the bottom surface of the second die, and wherein the second die is formed above the upper surface portion of the substrate; and
   support pillars having a first end that is coupled to the substrate and a second end on which the first die is supported.

9. The integrated circuit package defined in claim 8 wherein the substrate comprises a plurality of thermally conductive vias that are coupled to the thermally conductive block.

10. The integrated circuit package defined in claim 8 further comprising:
a plurality of pillars on the second die that electrically couple the second die to the first die.

11. The integrated circuit package defined in claim 7 wherein a layer of underfill is disposed between the first and second dies and the substrate.

12. An integrated circuit package, comprising:
a package substrate;
a thermally conductive block formed on a highest surface of the package substrate;
a first integrated circuit die mounted on the thermally conductive block;
a second integrated circuit die formed over the first integrated circuit die;
thermally conductive material disposed over the second integrated circuit die; and
a heat spreading lid that is placed directly on the thermally conductive material and on the highest surface of the package substrate, wherein the heat spreading lid serves as an external cover for the integrated circuit package.

13. The integrated circuit package defined in claim 12 wherein the thermally conductive block comprises silicon.

14. The integrated circuit package defined in claim 12 wherein the thermally conductive block comprises copper.

15. The integrated circuit package defined in claim 12 wherein the second integrated circuit die is electrically coupled to the first integrated circuit die by copper support pillars.

16. The integrated circuit package defined in claim 12 wherein the second integrated circuit die is electrically coupled to the first integrated circuit die by microbumps that pass signals between the first and second integrated circuit dies.

17. The integrated circuit package defined in claim 12 further comprising underfill material between the first integrated circuit die and the substrate.

* * * * *